(12) United States Patent
Lin et al.

(10) Patent No.: US 6,838,756 B2
(45) Date of Patent: Jan. 4, 2005

(54) CHIP-PACKAGING SUBSTRATE

(75) Inventors: Wei-Feng Lin, Hsinchu (TW);
Chung-Ju Wu, Kaohsiung (TW);
Chen-Wen Tsai, Hsinchu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/227,266

(22) Filed: Aug. 26, 2002

(65) Prior Publication Data

US 2003/0075781 A1 Apr. 24, 2003

(30) Foreign Application Priority Data

Oct. 18, 2001 (TW) .......................................... 90125801 A

(51) Int. Cl.[7] .......................................... H01L 23/495
(52) U.S. Cl. .................................. 257/676; 257/666
(58) Field of Search ................................. 257/666, 670, 257/672, 676, 726, 727, 678, 684, 685; 438/123, 124

(56) References Cited

U.S. PATENT DOCUMENTS 5,859,471 A * 1/1999 Kuraishi et al. ............. 257/666
6,284,572 B1 * 9/2001 Cantillep et al. ............ 438/112

* cited by examiner

Primary Examiner—Hung Vu
(74) Attorney, Agent, or Firm—Birch, Stewart, Kolasch & Birch, LLP

(57) ABSTRACT

A chip-packaging substrate. The substrate is capable of reducing damage during packaging, shrinking its connecting portions so that the length of any of the gap slots between the packaging portion and the frame portion of the substrate is increased. Furthermore, a dummy layer is provided to one surface of the frame portion to flush the surface on the frame portion with that of the packaging portion as much as possible.

20 Claims, 5 Drawing Sheets

CHIP-PACKAGING SUBSTRATE

BACKGROUND OF THE INVENTION

1. Field of the Invention

The present invention relates in general to a packaging substrate. More specifically, it relates to a chip-packaging substrate capable of reducing damage to the substrate during packaging.

2. Description of the Related Art

Ball Grid Array (hereinafter referred to as BGA) packaging is widely applied to package the integrated circuits of chip sets or graphic chips, etc. The BGA packaging has a plurality of tin balls provided onto the bottom surface of a substrate and arranged in a form of an array. The balls serve as the leads or pins (conductive media) between a chip (or IC) and a circuit board, replacing the conventional lead frames. The BGA packaging can provide not only more pins but also larger space between every two adjacent pins than that of conventional packaging, under the same size of substrate. Compared with the conventional QFP, with pin number up to 304 but whose pins are easily bent or twisted, BGA packaging is not subject to this issue. In addition, BGA packaging provides superior heat dissipation and electrical conductivity by providing shorter conducting paths between the chip and the circuit board.

According to the raw material of the substrate, BGA substrates are divided into three categories: Plastic BGA (PBGA), Metal BGA (MBGA), and Tape BGA (TBGA). The PBGA substrate is made of organic materials such as compounds of BT resin and glass fiber. It is the most popular BGA substrate in the packaging industry.

FIG. 1A shows a top view of a PBGA substrate. The PBGA substrate in FIG. 1A has four units, in the form of a 1×4 array, for packaging 4 chips. The packaging units of a PBGA substrate can also be arranged in the form of an n×m (n and m≧1) array for specific requirement. FIG. 1B shows an enlarged view of one unit 100 of the PBGA substrate. In FIG. 1B, the unit 100 comprises a rectangular packaging portion 102, a rectangular frame portion 104 enclosing the packaging portion 102 so that a gap exists between the outer edge of the packaging portion 102 and the inner edge of the frame portion 104, and four connecting portions (106a~106d) respectively provided to connect the four corner regions at the outer edge of the packaging portion 102 with the four corner regions at the inner edge of the frame portion 104. All the four connecting portions (106a~106d) are substantially L-shaped and connect the packaging portion 102 and the frame portion 104 to form the main body of the unit 100.

A first circuit layer (for example, a copper layer not shown in FIG. 1B) is provided on the top surface of the unit 100. An isolating paint covers the first circuit layer, only revealing a portion of the first circuit layer at some specific positions. A second circuit layer (for example, a copper layer not shown in FIG. 1B) is provided on the bottom surface of the unit 100. An isolating paint also covers the second circuit layer, only revealing a portion of the second circuit layer at some specific positions. The first and second circuit layers have corresponding connections electrically.

The main process for packaging a chip using the PBGA unit 100 comprises the steps of: (1) Assembly, (2) Molding, (3) Ball grid implantation, and (4) Singulation, as illustrated in FIG. 2.

Assembly mounts a die (chip) cut from a wafer to the top surface of the packaging portion 102 of the PBGA unit 100, and then provides gold bonding wires to electrically connect the die with the revealing first circuit layer.

Molding encapsulates the die mounted in the packaging portion 102, using a packaging body in conjunction with plastic (or glue) material.

Ball grid implantation forms a plurality of conductive balls, arranged in the form of an array, on the second circuit layer on the bottom surface of the PBGA unit 100.

Singulation separates the frame portion 104 and the encapsulated packaging portion 102 by destroying the connecting portions 106a~106d using press machine or cutting apparatus.

The first, second, third and fourth connecting portions (106a~106d) are of the same dimensions and sizes. Using the second connecting portion 106b as an example, each of the two branches of the L-shaped second connecting portion 106b extends a distance of L1 along the adjacent inner edge of the frame portion 104.

For the PBGA substrate with packaging area of 40 mm×40 mm (the area of the packaging portion 102), the distance of L1 is about 3 mm to 4 mm. The distance of L1 is long enough that the distance (L2) of the gap slot 108 becomes smaller. Consequently, damage such as cracks and chip-out will easily occur on the packaging portion 102 when carrying out the singulation process.

Additionally, no copper layer is formed on the top surface of the frame portion 104 and therefore the surfaces of the first circuit layer (formed on the packaging portion 102) and that of the frame portion 104 are not flush. The height difference between the surfaces of the packaging portion 102 and the frame portion 104 will cause glue overflow (disfiguring the outlook of the encapsulated chip) or pressing damage to packaging portion 102 of the PBGA substrate when molding.

SUMMARY OF THE INVENTION

Therefore, an object of the present invention is to provide a chip-packaging substrate capable of reducing damage to the substrate during packaging. The connecting portions of the substrate are shrunk so that the lengths of any of the gap slots between the packaging portion and the frame portion of the substrate are increased, thereby preventing damage such as cracking and chip-out when carrying out singulation.

The other object of the present invention is to provide a chip-packaging substrate having additional dummy layers provided to the surface of the frame portion of the substrate so that the height difference between the packaging portion and the frame portion is alleviated, thereby preventing the glue overflow and pressing damage during molding process.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1A:
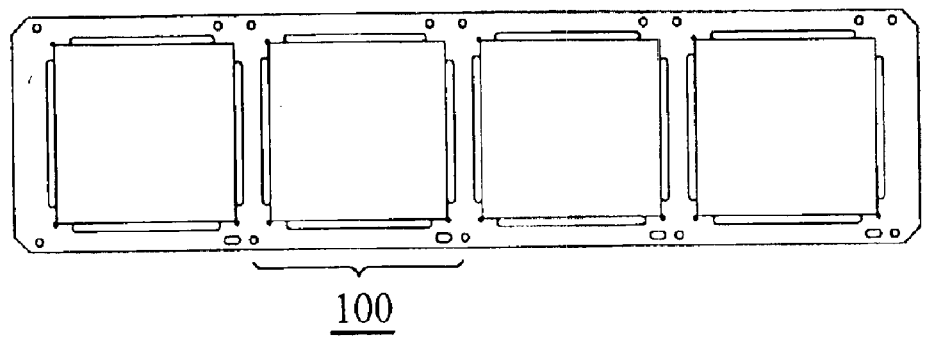
FIG. 1A shows a top view of a PBGA substrate.
Figure 1B:
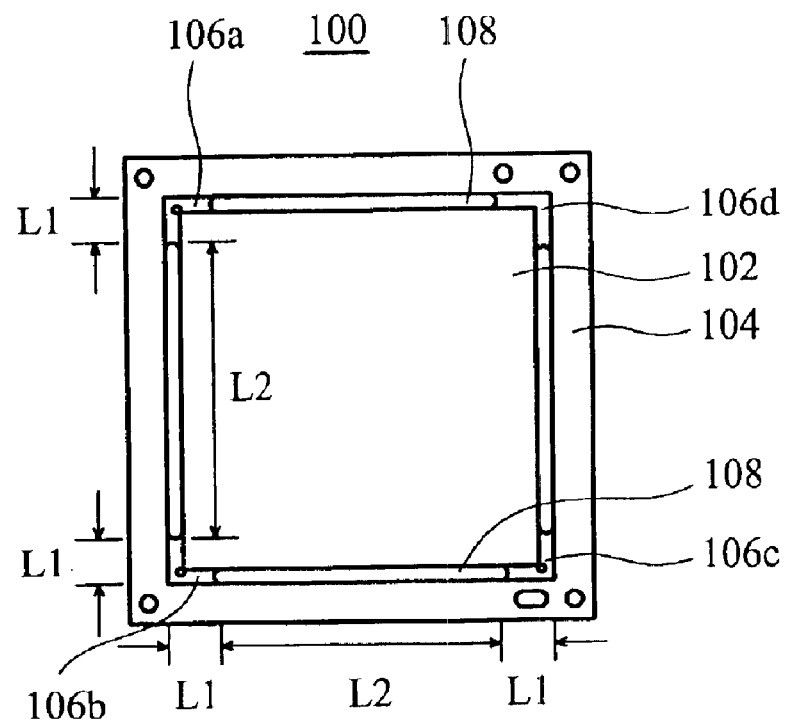
FIG. 1B shows an enlarged view of one unit of the PBGA substrate depicted in FIG. 1A.
Figure 2:
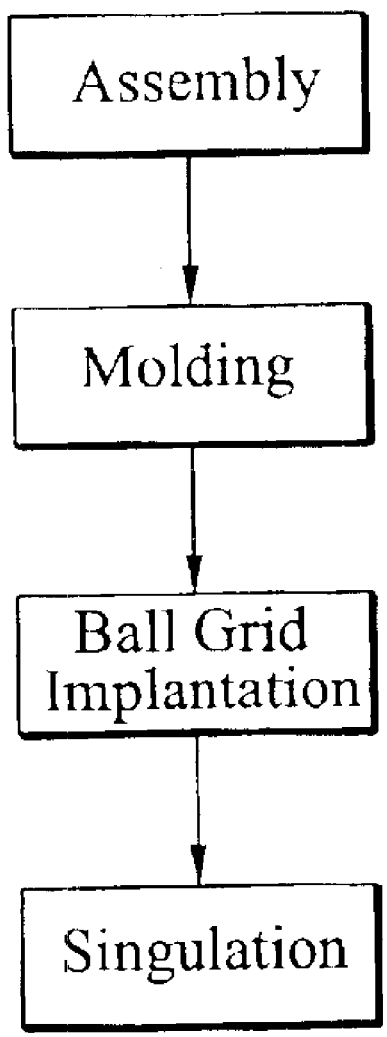
FIG. 2 shows a main process for packaging a chip using the PBGA substrate.
Figure 3A:
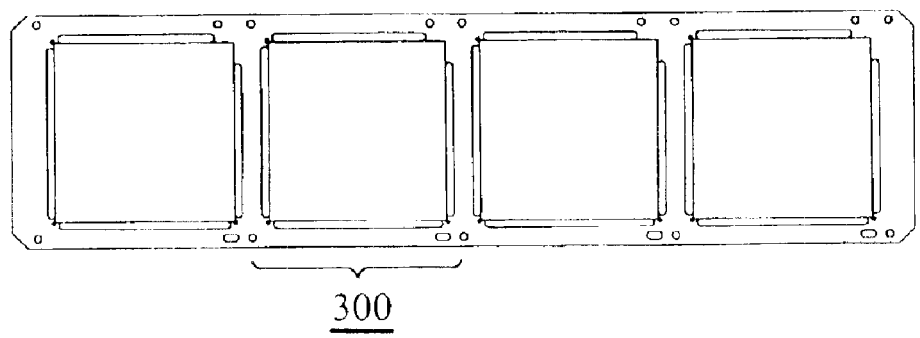
FIG. 3A shows a top view of a novel PBGA substrate according to one preferred embodiment of the present invention.

FIG. 3A shows a top view of a novel PBGA substrate according to one preferred embodiment of the present invention. The PBGA substrate depicted in FIG. 3A has four encapsulation units arranged in the form of a 1×4 array and can package four chips. The packaging units of a PBGA substrate can also be arranged in the form of an n×m (n and m≧1) array such as 2×4, 3×4 . . . , for specific requirement.

Figure 3B:
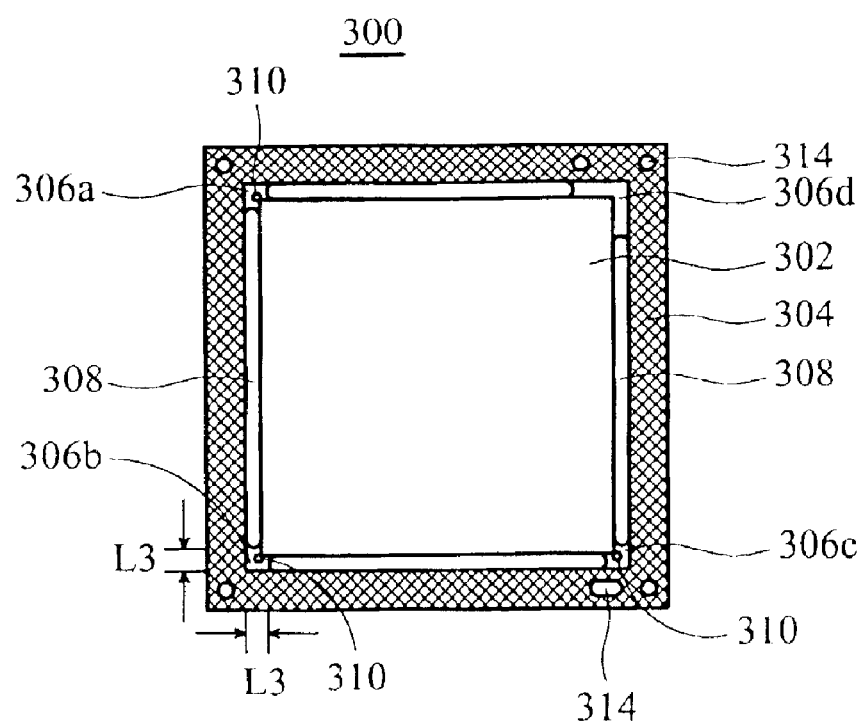
FIG. 3B shows an enlarged view of one unit of the PBGA substrate depicted in FIG. 3A.

FIG. 3B shows an enlarged view of one unit 300 of the PBGA substrate. In this embodiment, the specification of the PBGA substrate is 40 mm×40 mm (about the area of the packaging portion of the PBGA unit 300) but not limited to the above.

Referring to FIG. 3B, the unit 300 comprises a rectangular packaging portion 302, a rectangular frame portion 304 enclosing the packaging portion 102 so that a gap exists between the outer edge of the packaging portion 302 and the the inner edge of the frame portion 304, and four connecting portions (306a~306d) respectively provided to connect the four corner regions at the outer edge of the packaging portion 302 with the four corner regions at the inner edge of the frame portion 304. All the four connecting portions (306a~306d) are substantially L-shaped and connect the packaging portion 302 and the frame portion 304 to form the main body of the unit 300.

The first aspect of the present invention is that each of the two branches of any of the L-shaped first to third connecting portions 106a~106c has an extended distance of L3 along the adjacent inner edge of the frame portion 104 not greater than 2 mm, as depicted in FIG. 3B.

The first to third connecting portions 306a~306c are shrunk, therefore increasing the length of any of the gap slots 308. The packaging portion 302 and the frame portion 304 can easily be separated by destroying the connecting portions during the singulation process, preventing damage from crack and chip-out, etc.

Furthermore, through holes 310 are formed in the first to third connecting portions 306a~306c. Each of the through holes 310 is round and has a diameter between 0.8~1.2 mm.

Similar to the conventional art, a first circuit layer 320 (for example, a copper layer shown in FIG. 3C) is provided on the first surface of the packaging portion 302 (that is, the top surface of the unit 300). An isolating paint covers the first circuit layer, only revealing a portion of the first circuit layer at some specific positions. A second circuit layer 322 (for example, a copper layer shown in FIG. 3D) is provided on the second surface of the packaging portion 302 (that is, the bottom surface of the unit 300). An isolating paint also covers the second circuit layer, only revealing a portion of the second circuit layer at some specific positions, for placing ball grid layer 318. Also the first and second circuit layers have corresponding connections electrically.

Figure 3C:
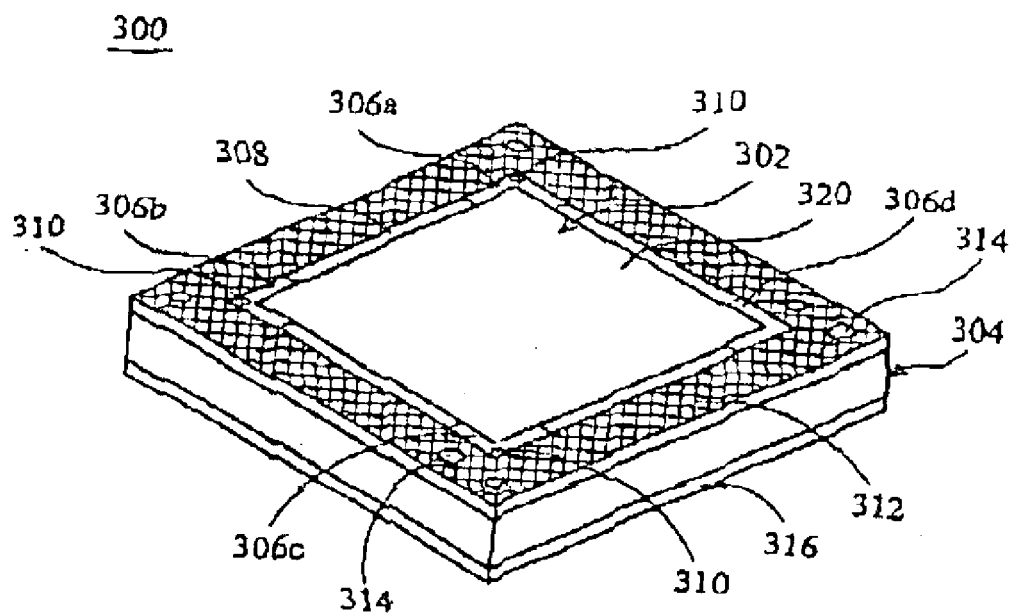
FIG. 3C shows an enlarged perspective view of the unit of the PBGA substrate shown in FIG. 3B.
Figure 3D:
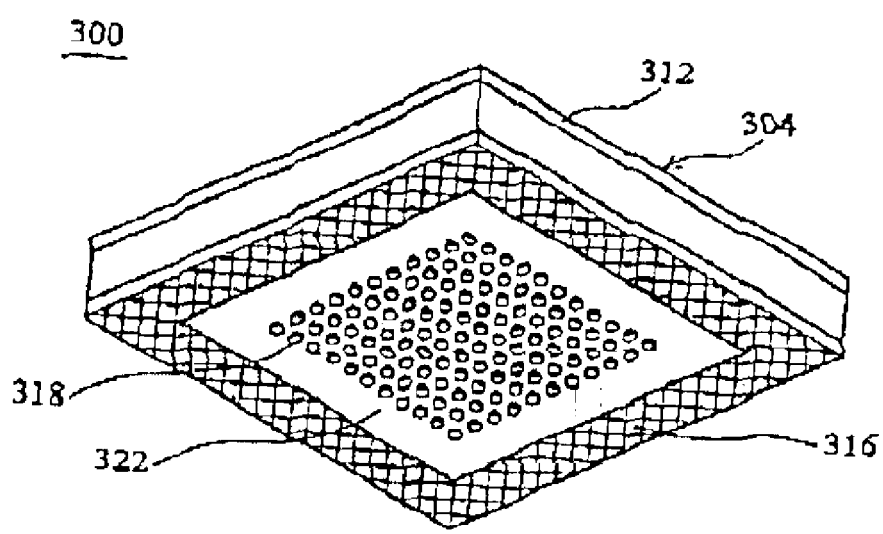
FIG. 3D shows another enlarged perspective view of the unit of the PBGA substrate shown in FIG. 3B.

Referring to FIGS. 3C and 3D, the second aspect of the present invention is that a first dummy layer 312 (for example a copper layer) is provided on the first surface of the frame portion 304, and covered with isolating paint. Without the first dummy layer 312, a height difference between the first surface of the frame portion 304 and the surface of the first circuit layer 320 will be introduced, resulting in the problems of glue overflow and pressing damage.

Similarly, a second dummy layer 316 (for example a copper layer, not shown in FIG. 3B) is provided on the second (or bottom) surface of the frame portion 304, and covered with isolating paint.

The first dummy layer 312 and second dummy 316 layer respectively have a specific pattern uniformly distributed on the first surface of each of the frame portions 304, referring to the FIGS. 3A and 3B. The first and second dummy layers 312, 316 are respectively mesh, lattice, or parallel line patterns. In this embodiment, the first dummy layer is mesh."

Figure 4:
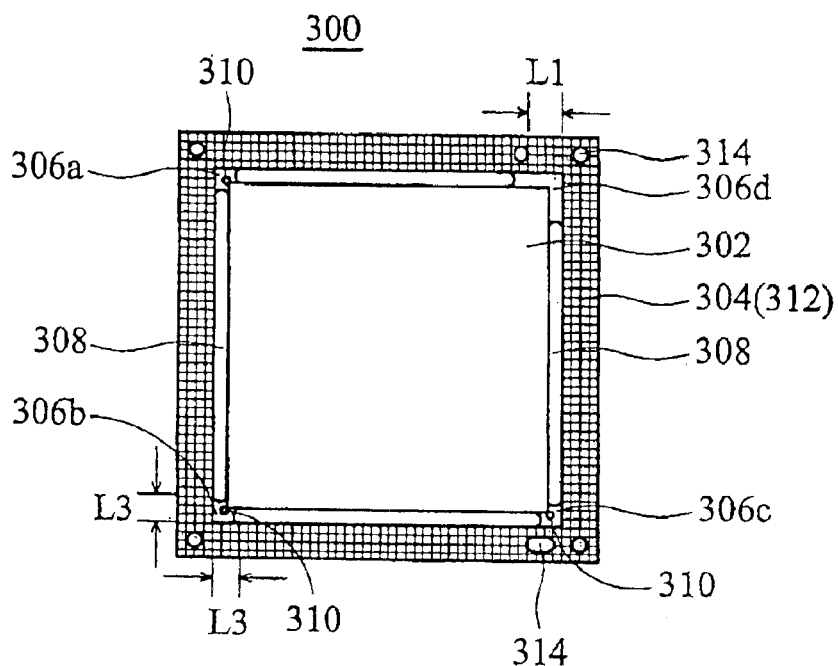
FIG. 4 shows the first dummy layer with the lattice pattern.
Figure 5:
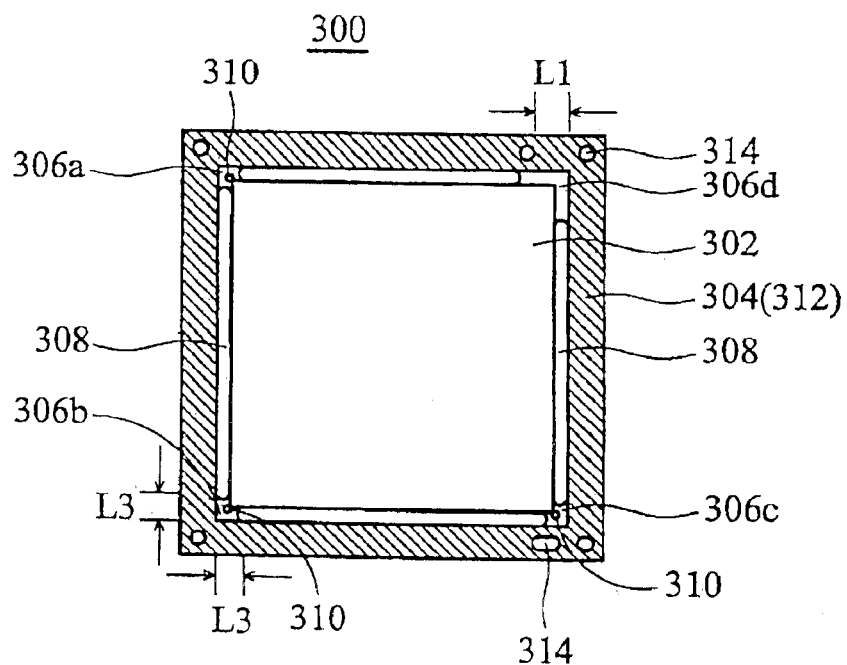
FIG. 5 shows the first dummy layer with a parallel line pattern.

FIGS. 4 and 5 show the first dummy layer with lattice pattern and parallel line pattern, respectively.

Also, a plurality of holes can be formed in the frame portion for positioning.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip-packaging substrate comprising:
   a rectangular packaging portion;
   a rectangular frame portion enclosing the packaging portion, so that a gap exists between the outer edge of the packaging portion and the inner edge of the frame portion;
   a first connecting portion, a second connecting portion, a third connecting portion and a fourth connecting portion respectively extending from the four corners of the inner edge frame portion and connected to the four corners of the outer edge packaging portion;
   wherein the extended distance of each of the first, second and third connecting portions along any side of the inner edge of the frame portion from the corresponding corner is not greater than 2 mm.

2. The chip-packaging substrate as claimed in claim 1, wherein each of the first, second and third portions has a through hole formed therein.

3. The chip-packaging substrate as claimed in claim 2, wherein the through hole is round and has a diameter between 0.8~1.2 mm.

4. The chip-packaging substrate as claimed in claim 1, wherein a circuit layer and a first dummy layer are respectively provided to a first surface of the packaging portion and the frame portion to make the packaging portion and the frame portion have the same height.

5. The chip-packaging substrate as claimed in claim 4, wherein a ball-grid layer and a second dummy layer are respectively provided to a second surface of the packaging portion and the frame portion to make the packaging portion and the frame portion have the same height.

6. The chip-packaging substrate as claimed in claim 5, wherein the first dummy layer is a mesh, lattice, or parallel line pattern.

7. The chip-packaging substrate as claimed in claim 5, wherein the second dummy layer has a specific pattern uniformly distributed on the second surface of the frame portion.

8. The chip-packaging substrate as claimed in claim 7, wherein the second dummy layer is a mesh, lattice, or parallel line pattern.

9. The chip-packaging substrate as claimed in claim 4, wherein the first dummy layer has a specific pattern uniformly distributed on the first surface of the frame portion.

10. The chip-packaging substrate as claimed in claim 1, wherein a plurality of positioning holes forms in the frame portion.

11. A chip-packaging substrate comprising:

a plurality of rectangular packaging portions;

a plurality of rectangular frame portions disposed in the form of an array, each of the frame portions enclosing one of the packaging portions, so that a gap exists between the outer edge of the packaging portion and the inner edge of the frame portion;

a plurality of first connecting portions, a plurality of second connecting portions, a plurality of third connecting portions and a plurality of fourth connecting portions, each of the first, second, third and fourth connecting portions respectively extending from the four corners of one of the frame portions at the inner edge and connected to the four corners of one corresponding packaging portion at the outer edge thereof;

wherein the extended distance of each of the first, second and third connecting portions along any side of the inner edge of each of the frame portions from the corresponding corner is not greater than 2 mm.

12. The chip-packaging substrate as claimed in claim 11, wherein each of the first, second and third portions has a through hole formed therein.

13. The chip-packaging substrate as claimed in claim 12, wherein the through hole is round and has a diameter between 0.8~1.2 mm.

14. The chip-packaging substrate as claimed in claim 11, wherein a circuit layer and a first dummy layer are respectively provided to a first surface of each of the packaging portions and the frame portions to make the packaging portion and the frame portion have the same height.

15. The chip-packaging substrate as claimed in claim 14, wherein a ball-grid layer and a second dummy layer are respectively provided to a second surface of each of the packaging portions and the frame portions to make the packaging portion and the frame portion have the same height.

16. The chip-packaging substrate as claimed in claim 15, wherein the first dummy layer is a mesh, lattice, or parallel line pattern.

17. The chip-packaging substrate as claimed in claim 15, wherein the second dummy layer has a specific pattern uniformly distributed on the second surface of each of the frame portions.

18. The chip-packaging substrate as claimed in claim 17, wherein the second dummy layer is a mesh, lattice, or parallel line pattern.

19. The chip-packaging substrate as claimed in claim 14, wherein the first dummy layer has a specific pattern uniformly distributed on the first surface of each of the frame portions.

20. The chip-packaging substrate as claimed in claim 11, wherein a plurality of positioning holes are formed in each of the frame portions.

* * * * *